United States Patent [19]

Yamagishi et al.

[11] Patent Number: 5,032,884
[45] Date of Patent: Jul. 16, 1991

[54] SEMICONDUCTOR PIN DEVICE WITH INTERLAYER OR DOPANT GRADIENT

[75] Inventors: Hideo Yamagishi; Masataka Kondo, both of Kobe; Kunio Nishimura, Kyoto; Akihiko Hiroe, Kobe; Keizou Asaoka, Kobe; Kazunori Tsuge, Kobe; Yoshihisa Tawada, Kobe; Minori Yamaguchi, Akashi, all of Japan

[73] Assignee: Kanegafuchi Kagaku Kogyo Kabushiki Kaisha, Osaka, Japan

[21] Appl. No.: 477,138

[22] Filed: Feb. 7, 1990

Related U.S. Application Data

[63] Continuation of Ser. No. 420,699, Oct. 11, 1989, abandoned, which is a continuation of Ser. No. 304,912, Feb. 2, 1989, abandoned, which is a continuation of Ser. No. 924,980, Oct. 30, 1986, abandoned.

[30] Foreign Application Priority Data

Nov. 5, 1985 [JP] Japan .................................. 60-247463
Nov. 14, 1985 [JP] Japan .................................. 60-255681
Apr. 30, 1986 [JP] Japan .................................. 61-99939

[51] Int. Cl.⁵ .......................................... H01L 27/14
[52] U.S. Cl. ........................................ 357/30; 357/58; 357/2; 357/90; 136/249; 136/258
[58] Field of Search ............... 357/58, 2, 90, 30 F, 357/30 J, 30 K, 30 L, 30 P, 30 B; 136/249, 258

[56] References Cited

U.S. PATENT DOCUMENTS

| 3,984,858 | 10/1976 | Cornu et al. ............... | 357/58 X |
| 4,117,506 | 9/1978 | Carlson et al. ............... | 357/30 K |
| 4,142,200 | 2/1979 | Mizushima et al. ............... | 357/30 F |

(List continued on next page.)

FOREIGN PATENT DOCUMENTS

| 75021/81 | 3/1982 | Australia . |
| 19937/83 | 4/1984 | Australia . |
| 20420/83 | 5/1984 | Australia . |
| 0070509 | 1/1983 | European Pat. Off. . |
| 0093514 | 11/1983 | European Pat. Off. . |
| 0099720 | 2/1984 | European Pat. Off. . |
| 5864070 | 10/1981 | Japan . |
| 5975682 | 10/1982 | Japan . |
| 59-229878 | 12/1984 | Japan . |
| 60-50972 | 3/1985 | Japan . |
| WO84/02229 | 6/1984 | PCT Int'l Appl. . |
| 2137810 | 10/1984 | United Kingdom . |

OTHER PUBLICATIONS

Lim et al, "A Novel Structure, High Conversion Efficiency p-SiC/Graded p-SiC/i-Si/n-Si/Metal Substrate-type Amorphous Silicon Solar Cell," *J. Appl. Phys.* 56(2), Jul. 15, 1984, pp. 538-542.
Patent Abstract of Japan, vol. 8, No. 185, Aug. 24, 1984.
Patent Abstract of Japan, vol. 7, No. 154, Jul. 6, 1983.

*Primary Examiner*—William Mintel
*Attorney, Agent, or Firm*—Armstrong, Nikaido, Marmelstein, Kubovcik & Murray

[57] ABSTRACT

A semiconductor device comprising a pin-type or nip-type amorphous-containing semiconductor layers; characterized in that (1) at least one interlayer made of semiconductor or insulator having higher electrical resistivity than a semiconductor which adjoins the interlayer is/are interposed between semiconductor layers or between a semiconductor and an electrode, (2) an amount of dopant in a p-type or n-type layer is least at a junction interface of p/i or n/i and increases gradually toward a junction interface of p/electrode or n/electrode, or (3) a p-type semiconductor layer being the same conductive type as the p-type semiconductor and having higher impurity density and/or an n-type semiconductor layer being the same conductive type as the n-type semiconductor layer and having higher impurity density is/are interposed between the p-type semiconductor layer and the electrode at the side of the p-type semiconductor layer and/or between the n-type semiconductor layer and the electrode at the side of the n-type semiconductor layer. According to the semiconductor device of the present invention (in the case of (1) or (2)), large Voc and electric current at a specific voltage can be obtained, further in the case of (3), photoelectric conversion efficiency can be improved.

21 Claims, 8 Drawing Sheets

U.S. PATENT DOCUMENTS

| | | | |
|---|---|---|---|
| 4,200,473 | 4/1980 | Carlson | 357/30 J X |
| 4,251,287 | 2/1981 | Dalal | 357/30 K X |
| 4,255,211 | 3/1981 | Fraas | 357/30 J X |
| 4,379,943 | 4/1983 | Yang et al. | 136/249 |
| 4,398,054 | 8/1983 | Madan | 357/30 J X |
| 4,415,760 | 11/1983 | Madan | 136/258 |
| 4,485,265 | 11/1984 | Gordon et al. | 357/30 J X |
| 4,522,663 | 6/1985 | Ovshinsky et al. | 357/30 K X |
| 4,531,015 | 7/1985 | Wong et al. | 136/258 |
| 4,598,304 | 7/1986 | Tanaka et al. | 357/30 F X |
| 4,633,031 | 12/1986 | Toborof | 357/30 J X |
| 4,742,012 | 5/1988 | Matsumura et al. | 357/30 X |

SEMICONDUCTOR PIN DEVICE WITH INTERLAYER OR DOPANT GRADIENT

This application is a continuation of application Ser. No. 420,699 filed Oct. 11, 1989, now abandoned, which is a continuation of application Ser. No. 304,912 filed Feb. 2, 1989, now abandoned, which is a continuation of application Ser. No. 924,980, filed Oct. 30, 1986, now abandoned.

BACKGROUND OF THE INVENTION

The present invention relates to a semiconductor device, and more particularly to a semiconductor device comprising a photovoltaic device having high open-circuit voltage under light irradiation or a photovoltaic device having improved photoelectric conversion efficiency.

Hitherto, as a material for photoelectric converters such as solar cells, there has been used a semiconductor material comprising an amorphous semiconductor such as a-Si:H, a-Si$_{1-x}$C$_x$:H, a-Si$_{1-x}$Ge$_x$:H, a-Si:F:H, a-Si$_{1-x}$N$_x$H, a-Ge:H, a-Si$_{1-x}$Ge$_x$:F:H, a-Si:H, $\mu$c-Si:H, $\mu$c-Si$_{1-x}$Ge$_x$:H (wherein x satisfies the relationship 0 <x <1) or a semiconductor material composed partially of these amorphous semiconductors.

A conventional solar cell has a laminated structure pin, nip, pinpin. . . or nipnip. . . obtained by depositing in order the same kind of amorphous semiconductor or a different kind of amorphous semiconductor having a wide energy gap only in its doped layer. The density of dopant in the p-type or n-type layer is uniform throughout the direction of the thickness of the layer except for the distribution of dopant due to thermal diffusion during and after the production of the device, and it is usually 0.01 to 5 atm %.

Figure 9:
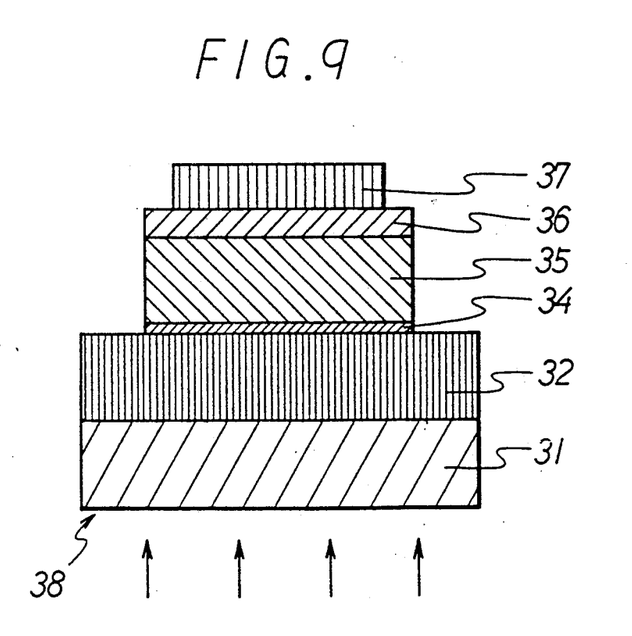
FIG. 9 is a sectional view of a conventional semiconductor device.

FIG. 9 shows a semiconductor device employed in a conventional solar cell using a pin-type semiconductor of triple layer construction. In FIG. 9, numeral 31 is a glass substrate whereon a transparent electrode 32 is attached. On the transparent electrode 32, there are formed a p-type semiconductor layer 34 i-type semiconductor layer 35 and n-type semiconductor layer 36 in order. Further, on the n-type semiconductor layer 36, there is formed an electrode 37. The semiconductor device 38 consists of a glass substrate 31, a transparent electrode 32, a p-type semiconductor layer 34, an i-type semiconductor layer 35, an n-type semiconductor layer 36 and an electrode 37.

In the above semiconductor device 38, light enters the glass substrate 31 along the direction of the arrows in FIG. 9, is transmitted by the glass substrate 31 and the electrode 32, and then irradiates the p-type semiconductor layer 34, i-type semiconductor layer 35 and n-type semiconductor layer 36. By this irradiation, pairs of electrons and holes are generated in each semiconductor layer 34, 35 and 36. Then, electrons are collected in the n-type layer and holes are collected in the p-type layer and thereby, there are generated positive charges at the transparent electrode 32 and negative charges at the electrode 37. Thus, a photoelectric conversion is carried out enabling the semiconductor device 38 to function as a photocell.

However, a semiconductor device having the above construction has a drawback in that its voltage value in open-circuit condition (hereinafter referred to as Voc) during the irradiation of light cannot be increased, since the semiconductor device has a limitation in increasing a built-in field.

In using the above devices, for example, when an electromotive force greater than Voc is required, a plurality of devices can be connected in series in order to remove the above drawback. Even in that case, however, the number of series connections can be decreased if the Voc per device can be improved. Further, the performance of devices can be expected to be remarkably improved by making the area of each semiconductor layer large, even in case where the total area of all the devices is limited.

As a result of vigorous investigation focusing on the construction of a semiconductor, we inventors have discovered a semiconductor device having higher Voc and electric current (operating electric current) at a specific voltage than conventional semiconductor devices, without increasing the number of series connections and total area of all the devices, and have completed the semiconductor device of the present invention.

Furthermore, in the conventional semiconductor device, it is generally known that the contact resistance between a p-type semiconductor layer and the electrode at the side of the p-layer and between an n-type semiconductor layer and the electrode at the side of the n-layer decreases as the impurity density increases. It is desirable to make this contact resistance small, because it reduces the fill factor of a photovoltaic device when the p-type semiconductor layer and n-type semiconductor layer are used as a photovoltaic device such as a solar cell. Therefore, from this point of view, it is desirable to increase the impurity density. However, if the impurity density of the n-type and p-type semiconductor layers becomes too large, the characteristics of the photovoltaic device deteriorate due to the large absorption loss of light in the parts that contain the impurity.

The present invention was made to solve the above problems, and an object thereof is to provide a semiconductor device having high open-circuit voltage under light irradiation, and a semiconductor device having improved photoelectric conversion efficiency.

SUMMARY OF THE INVENTION

In accordance with the present invention, there is provided a semiconductor device comprising accumulated semiconductor layers of the p-type, i-type and n-type containing amorphous portions and a first and second electrodes, or comprising accumulated semiconductor layers of the n-type, i-type and p-type containing amorphous portions and electrodes at both main surfaces, characterized in that at least one interlayer made of semi-conductor or insulator having higher electrical resistivity than a semiconductor which adjoins the interlayer is/are formed between semiconductor layers or between a semiconductor and an electrode.

The present invention further provides a semiconductor device comprising an at least partially amorphous semiconductor layer of the pin-type or nip-type and at least two electrodes, characterized in that the amount of dopant in a p-type or n-type layer is lowest at the junction interface of p/i or n/i and increases gradually toward the interface of p/electrode or n/electrode The present invention still further provides a semiconductor device comprising an at least partially amorphous semiconductor layer of the nip-type or pin-type, an electrode connected to a p-type layer in the semiconductor and an electrode connected to an n-type layer in the semiconductor, characterized in that at least one of (I) a p-type semiconductor layer of the same conductive type as the p-type semiconductor and having a higher impurity density and (II) an n-type semiconductor layer of the same conductive type as the n-type semiconductor layer and having a higher impurity density is/are interposed between the p-type semiconductor layer and the electrode at the side of the p-type semiconductor layer and/or between the n-type semiconductor layer and the electrode at the side of the n-type semiconductor layer.

In the present invention, the term of "pin-type or nip-type device" means a device comprising at least one of each of the following layers: (A) a layer of one conductivity type, (B) a non-doped or slightly doped substantially intrinsic layer and (C) a conductive layer of a type opposite said conductive layer A; and at least two electrodes. Further, it naturally includes a device comprising a plurality of p, i and/or n layers; and a tandem type device wherein a unit of pin or nip is stacked.

BRIEF DESCRIPTION OF THE DRAWINGS

Each of FIGS. 1A, 1B and 1C is a schematic diagram of a semiconductor device comprising a pin-type semiconductor layer and explaining the first aspect of the present invention.

Each of FIGS. 2A, 2B and 2C is a schematic diagram of a semiconductor device comprising a nip-type semiconductor layer and explaining the first aspect of the present invention.

DETAILED DESCRIPTION

The first aspect of the present invention is explained first.

The term "at least partially amorphous semiconductor device of pin-type or nip-type" generally means such a device that has a construction used in a-Si photovoltaic devices or photodiodes. Any semiconductor device can be employed in the present invention as long as it satisfies this condition.

Further, the term "at least partially amorphous semiconductor" means (1) a semiconductor composed solely of amorphous material, (2) a semiconductor wherein a microcrystalline semiconductor is dispersed in an amorphous semiconductor, or (3) a semiconductor wherein an amorphous semiconductor is dispersed in a large granular crystalline semiconductor. These semiconductors are generally called nonsingle crystalline semiconductors.

There can be preferably employed boron-doped a-Si:H, a-Si$_{1-x}$C$_x$:H, or the like as an at least partially amorphous semiconductor layer of the p-type (hereinafter referred to as p-type layer); a-Si:H, a-Si$_{1-x}$Ge$_x$:H, or the like as an at least partially amorphous semiconductor layer of the i-type (hereinafter referred to as i-type layer); phosphorus-doped a-Si:H, µc-Si:H, or the like as an at least partially amorphous semiconductor layer of the n-type (hereinafter referred to as n-type layer), which are used in conventional amorphous semiconductor photovoltaic devices or photodiodes.

As an interlayer in the present invention having larger electrical resistivity than a semiconductor layer which adjoins the interlayer, there can preferably be employed, in general, a layer having a conductivity of not more than one-tenth of that of the i-type layer (the conductivity of the i-type layer is, for example, about $5 \times 10^{-9}$ ($\Omega$.cm)$^{-1}$ in the case of a-Si:H), and not more than one-hundredth of that of the p-type or n-type layer adjoining the interlayer. Concrete examples of the above interlayer are, for instance, titanium oxide film or silicon oxide film obtained by electron beam vacuum deposition; Si$_{1-x}$N$_x$:H or Si$_{1-x}$C$_x$:H (wherein x satisfies the relationship $0<x<1$); Si$_{1-x}$C$_x$:X:Y, Si$_{1-x}$N$_x$:X:Y or Si$_{1-x}$O$_x$:X:Y (wherein x satisfies the relationship $0<x<1$; X is H, Cl, F or Br; and Y is H, Cl, F or Br) which have little influence upon the short current, curve factor and other factors; and an insulator which does not have undesired influence upon the other layers. Among these examples, Si$_{1-x}$C$_x$:H (wherein x satisfies the relationship $0<x<1$) is particularly preferable in that it can remarkably improve Voc.

The electrical resistivity of the above semiconductors can be easily adjusted by varying the composition, i.e. the value of "x" or the amount of dopant in the above-mentioned formulas. In the present invention, for instance, 0.001 to 5 atm % of trivalent or pentavalent elements such as P or B is used as a dopant.

Figure 1A:
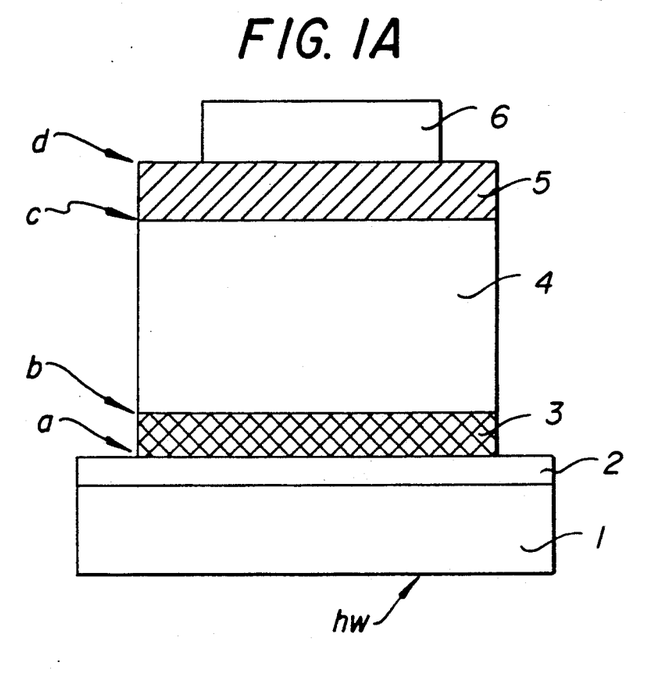
Figure 2A:
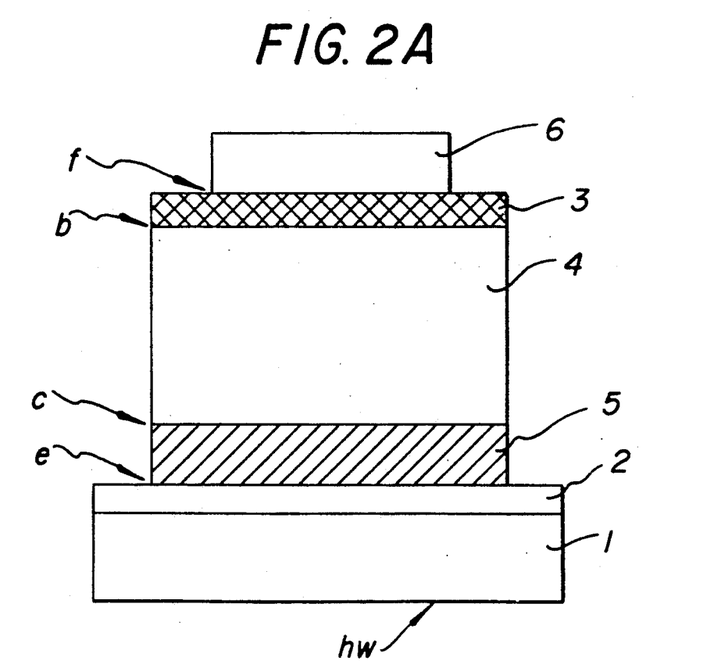

The interlayer, which has a higher electrical resistivity than the semiconductor layer adjoining the interlayer, can be formed at a junction interface (a) of a transparent electrode 2 and p-type layer 3 of the pin-type semiconductor device shown in FIG. 1A; a junction interface (b) of p-type layer 3 and i-type layer 4 as shown in FIG. 1A; a junction interface (c) of i-type layer 4 and n-type layer 5 as shown in FIG. 1A; a junction interface (d) of n-type layer 5 and a metal electrode 6 as shown in FIG. 1A; a junction interface (e) of n-type layer 5 and a transparent electrode 2 of the nip-type semiconductor device shown in FIG. 2A; a junction interface (f) of p-type layer 3 and a metal electrode 6 as shown in FIG. 2A; a junction interface (b) of p-type layer 3 and i-type layer 4 as shown in FIG. 2A; a junction interface (c) of i-type layer 4 and n-type layer 5 as shown in FIG. 2A; and a p-type or n-type layer. In the case of a semiconductor device shown in FIG. 1A, it is preferable to form the interlayer at a junction interface (a) of a transparent electrode 2 and p-type layer 3, particularly at a junction interface (b) of p-type layer 3 and i-type layer 4 because such interfaces are at the side of light incidence and thereby Voc can be further improved.

Figure 1B:
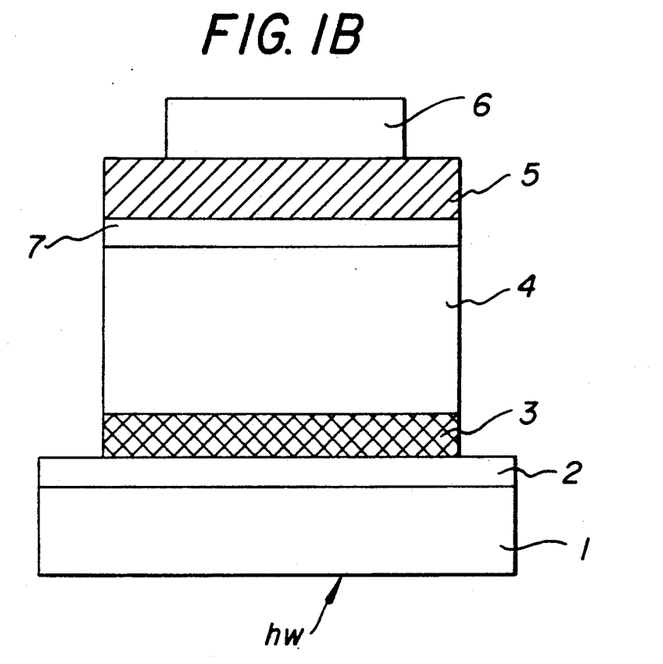
Figure 1C:
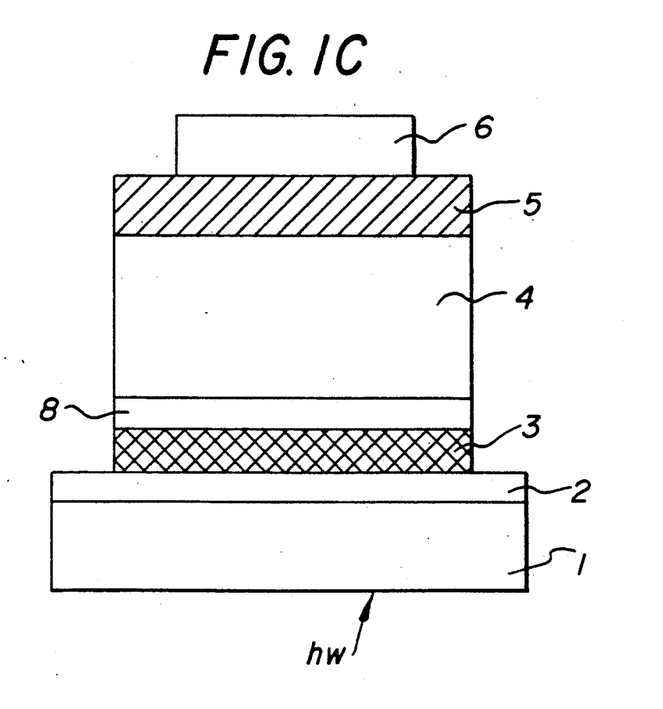
Figure 2B:
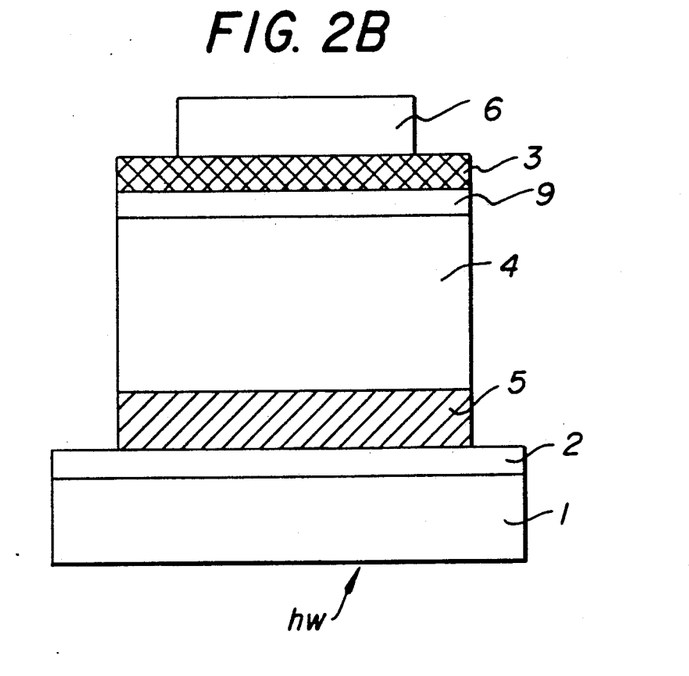
Figure 2C:
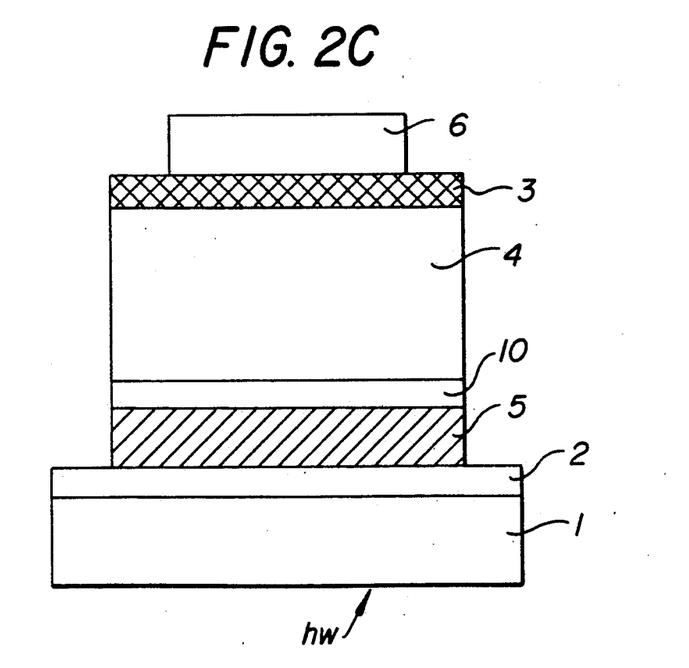

FIG. 1B shows an embodiment of the first aspect of this invention wherein the interlayer is a semiconductor layer 7 provided between an n-type layer and an i-type layer. FIG. 1C shows an embodiment of the first aspect of this invention wherein the interlayer is a semiconductor layer 8 provided between an n-type layer and an i-type layer. FIG. 2B shows an embodiment of the first aspect of the invention wherein the interlayer is a semiconductor layer 9 provided between a p-type layer and an i-type layer. FIG. 2C shows an embodiment of the first aspect of this invention wherein the interlayer is a semiconductor layer 10 provided between an n-type layer and an i-type layer.

The thickness of the interlayer, which is formed between semiconductor layers or between a semiconductor layer and an electrode and comprises a semiconductor or insulator having higher electrical resistivity than a semiconductor layer which adjoins the interlayer, is 10 to 500 Å, preferably 10 to 200 Å, more preferably 10 to 100 Å. When the thickness of the interlayer is less than 10 Å, the improvement of Voc is small, and on the other hand when it is more than 500 Å, the reduction of the curve factor becomes large.

In the semiconductor device of the present invention, the interlayer can be produced by a glow discharge decomposition method, sputtering method, thermal CVD method, photo CVD method or the like, using a device that has fundamentally a pin-type or nip-type semiconductor layer such as a single-type device, tandem-type device or an integrated-type device. In the present invention, the employable semiconductors are not particularly limited. That is, any semiconductor can be used as long as it comprises a pin-type or nip-type semiconductor.

A semiconductor device of the present invention obtained by the above method is preferably used under a light source of low illuminance such as a fluorescent lamp in which series resistance would not pose a serious problem, because the semiconductor device of the present invention causes an increase in series resistance and thereby lowers the curve factor, or the like.

There can be obtained a semiconductor device having large Voc and electric current under a specific voltage like the above-mentioned device, by adding to an interlayer a very small amount of dopant to such an extent that the electric resistivity of the interlayer does not become smaller than that of a semiconductor layer which adjoins the interlayer.

Next, the second aspect of the present invention is explained.

As an i-type layer in the at least partially amorphous pin-type or nip-type semiconductor layers in the present invention, there can be used a layer of about 2500 to 9000 Å in thickness comprising, for instance, a-SiC:H, a-Si:H, a-SiGe:H, a-Ge:H, a-Si:F:H, a-SiN:H or a-SiSn:H; or these amorphous semiconductors doped by B or P. As a p-type layer, there can be used a layer of about 80 to 300 Å in thickness formed by doping, for instance, a-SiC:H, μc-Si:H or a-Si:H with elements of group IIIa of the Periodic Table which are p-type dopants. Further, as a n-type layer, there can be used a layer of about 80 to 3000 Å in thickness formed by doping, for instance, a-Si:H, μc-Si:H or a-SiC:H with elements of group Va of the Periodic Table which are n-type dopants. However, the i-type layer, p-type layer and n-type layer in the present invention are not limited to the above-mentioned layers.

Among the above-mentioned p-type layers, layers obtained by doping a-SiC:H or a-Si:H with elements of group IIIa are preferable because they have a small activation energy and small light absorption loss. Further, among the above-mentioned n-type layers, layers obtained by doping a-SiC:H, μc-Si:H or a-Si:H with elements of group Va are preferable because they have a small activation energy and high conductivity.

In the foregoing explanation, there are described, as a p-type dopant, elements of group IIIa of the Periodic Table, i.e., B, Al, Ga, In and Tl; and, as an n-type dopant, elements of group Va of the Periodic Table, i.e. N, P, As, Sb, Te and Po. However, dopants employable in the present invention are not limited to those described above, and any dopant can be used as long as it can produce a p-type or n-type semiconductor by doping therewith.

In the pin-type or nip-type semiconductor layer of the second aspect of the present invention, there is provided, in at least one of the p-type layer and n-type layer, a part wherein the amount of dopant in the p-type layer or n-type is lowest at the junction interface of p/i or n/i and increases gradually toward the junction interface of p/electrode or n/electrode.

Figure 3:
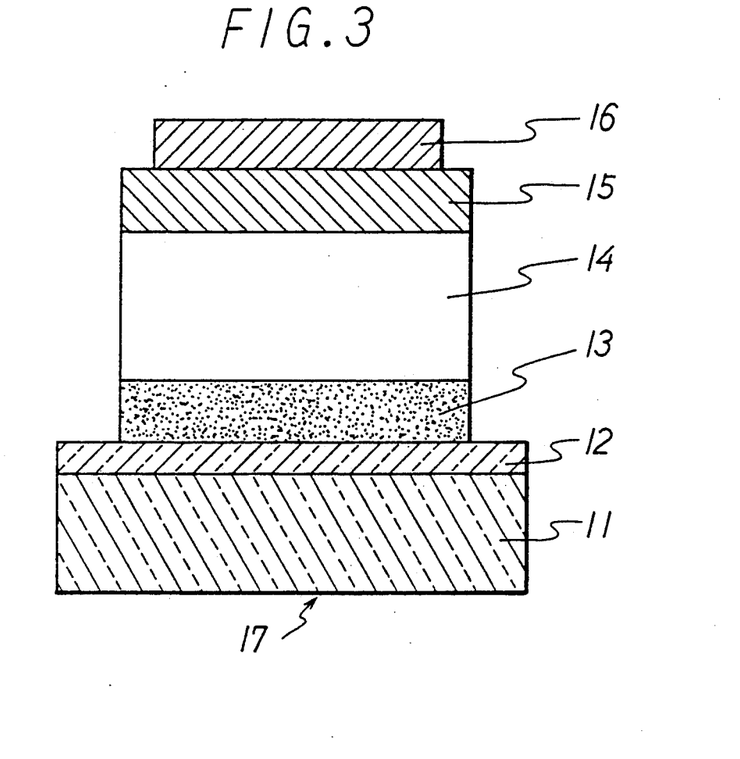
FIG. 3 is a view explaining an embodiment of a semiconductor device of the second aspect of the present invention.

FIG. 3 is a view explaining an embodiment of a semiconductor device of the present invention. In FIG. 3, on a glass substrate 11 having a transparent electrode 12 there is provided a p-type semiconductor layer 13 in such a manner that the amount of dopant is least at the junction interface of p/i. On the p-type semiconductor layer 13, an i-type semiconductor layer 14, an n-type semiconductor layer 15 and a rear electrode 16 are formed in order.

Figure 4:
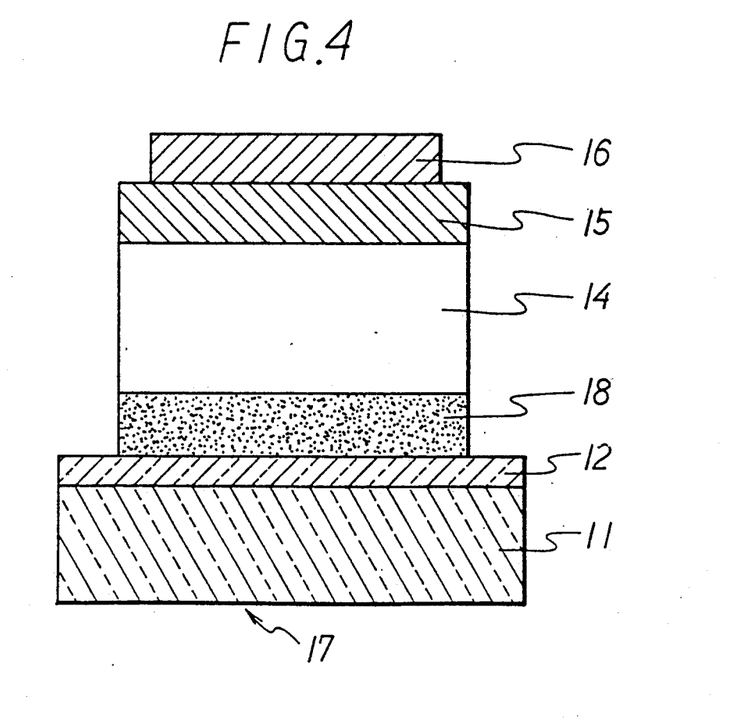
FIG. 4 is a view explaining an embodiment of a conventional semiconductor device.

In the semiconductor device of FIG. 3, the amount of dopant is least at the junction interface of p/i. However, the semiconductor device can be produced in such a manner that the distribution of dopant in the p-type semiconductor layer is uniform and the amount of dopant is least at the junction interface of n/i in the n-type semiconductor layer. The semiconductor device can further be produced in such a manner that the amount of dopant in both p-type and n-type semiconductor layers is least at the junction interfaces of p/i and n/i respectively. In FIG. 3, light 17 enters from the side of the p-type layer, but it might enter from the side of the n-type layer. The number of pin-layers is not limited to one, but it might be stacked to 2 to 5 layers, In that case, layers on the first pin-layer may also be made in such a manner that the amount of dopant is least at the junction interface of the i-layer, or may be made of the usual pin-layers shown in FIG. 4. Numeral 18 in FIG. 4 is a usual p-type layer.

The amount of dopant used in the p-type or n-type layer is usually 0.01 to 5 atm %, but in the present invention the amount of dopant in the neighborhood of a junction interface of p/i or n/i (at which the amount of dopant is least, preferably in the portion 20 to 30 Å from the junction interface, more preferably in the portion 100 Å from the junction interface) is preferably not more than 0.01 atm %, more preferably not more than 0.001 atm %. These facts are made clear from the results of trial manufactures of semiconductor devices by the inventors.

The distribution of dopant is required to increase gradually from the junction interface of p/i or n/i to the junction interface of p/electrode or n/electrode. By this constitution, the diffusion of dopant into the i-layer is reduced and the interface between the i-layer and dopant-layer is improved, and accordingly the open-circuit voltage is increased.

In the present specification, the expression "gradual increase" does not mean a natural increase of dopants caused by the thermal diffusion, but means successive or stairs-like increase obtained by adjusting the amount of dopant. In that case, from the viewpoint of increasing Voc, it is preferable that the components other than the dopant in the p-type or n-type layer do not substantially change.

Figure 5:
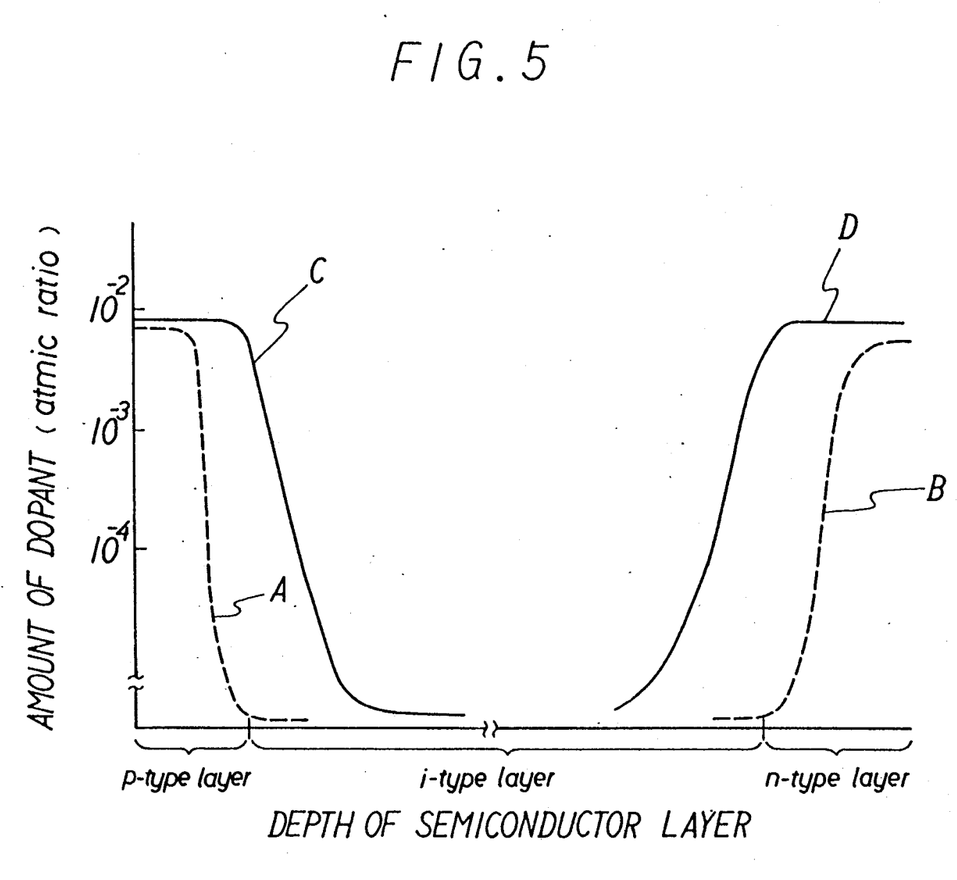
FIG. 5 is a view explaining an example of the distribution of dopant in a pin-type semiconductor layer used in the second aspect of the present invention and an example of the distribution of dopant in a conventional pin-type semiconductor layer.

FIG. 5 is a view explaining an embodiment of the distribution of dopant in a semiconductor device of the second aspect of the present invention wherein p-type, i-type and n-type layers comprise a-SiC:H, a-Si:H and a-Si:H, respectively. In FIG. 5, A is a graph showing the distribution of p-type dopant in a p-type semiconductor layer, B is a graph showing the distribution of n-type dopant in an n-type semiconductor layer, and C and D are graphs showing distributions of the p-type dopant and n-type dopant in a conventional semiconductor device.

FIG. 5 only shows a preferable example of the distribution of dopant in the p-type or n-type layer, and the condition of distribution is not limited to that shown in FIG. 5. In other words, it is only required that the dopant content of at least one conductivity layer is minimized at a junction interface of p/i or n/i.

In producing a semiconductor device of the present invention using a-SiC:H as a doped layer, an insulating layer which is not doped exists at a junction interface of p/i or n/i. In the present invention, such a construction is employable.

Electrodes used in the present invention are not particularly limited, but there can be employed a transparent electrode, metal electrode, silicide electrode, or a laminated electrode obtained from these materials, which are usually used in producing solar cells.

As an apparatus for producing a semiconductor in the present invention, there can be employed a parallel-plate capacitively-coupled type plasma CVD apparatus, an inductively-coupled type plasma CVD apparatus, thermal CVD apparatus, ECR plasma CVD apparatus, photo CVD apparatus, excited species CVD apparatus, and the like. But employable apparatuses are not limited to these. The method of producing the semiconductor in the present invention and the material used therein are not particularly limited.

A pin construction or nip construction in the present invention is one generally used in photovoltaic devices or photodiodes comprising amorphous semiconductor.

Next, the third aspect of the present invention is explained.

A semiconductor device in the third aspect of the present invention comprises an at least partially amorphous semiconductor of the nip-type or pin-type, wherein at least one semiconductor layer (I) of the same conductivity type as the adjacent semiconductor (II) and having a higher impurity density is/are interposed between the semiconductor layer (II) and an electrode.

In an at least partially amorphous semiconductor of the pin-type or nip-type used in the third aspect of the present invention, as an i-type semiconductor layer, there an be used a layer of about 200 to 9000 Å in thickness comprising, for example, a-Si:H, a-SiGe:H, a-Ge:H, a-Si:F:H, a-SiN:H or a-SiSn:H, a-SiC:H, or these amorphous semiconductors doped by a very small amount of B or P. As a p-type semiconductor layer, there can be used a layer of about 80 to 300 Å in thickness formed by doping, for instance, a-SiC:H, uc-Si:H or a-Si:H with elements of group IIIa of the Periodic Table. Further, as an n-type semiconductor layer, there can be used a layer of about 80 to 300 Å in thickness formed by doping, for instance, a-Si:H, $\mu$c-Si:H or a-SiC:H with elements of group Va of the Periodic Table. However, the i-type, p-type and n-type semiconductor layers in the present invention are not limited to the above-mentioned layers.

Among the above-mentioned p-type semiconductor layers, layers obtained by doping a-SiC:H or a-Si:H with elements of group IIIa are preferable because they have a small activation energy and generate holes which contribute to the conductivity of semiconductors, and have a small light absorption loss. Further, among the above-mentioned n-type semiconductor layers, layers obtained by doping a-SiC:H, $\mu$c-Si:H or a-Si:H with elements of group Va are preferable because they have a small activation energy and generate electrons which contribute to the conductivity of semiconductors and increase conductivity. However, materials used in the above i-type, p-type and n-type semiconductor layers are not limited to those described above.

In the foregoing explanation, there are described as a p-type dopant, elements of group IIIa of the Periodic Table, i.e. B, Al, Ga, In and Tl; and, as an n-type dopant, elements of group Va of the Periodic Table, i.e. N, P, As, Sb, Te and Po. However, dopants employable in the present invention are not limited to those described above, and any dopant can be used as long as it can produce a p-type or n-type semiconductor by doping therewith.

In the present invention, the impurity density of the p-type and/or n-type layer, interposed between a p-type semiconductor layer and an electrode at the side of the p-type semiconductor layer and/or between the n-type semiconductor layer and the electrode at the side of the n-type semiconductor layer, is more than two times, preferably more than four times the usual impurity density. The upper limit of the impurity density is not particularly limited, but is usually adjusted to not more than 10 atm %. The thickness of the high density semiconductor layers is 10 to 300 Å, preferably 30 to 150 Å.

Now, are explained Examples and Comparative Examples with respect to the first, second and third aspects of the present invention, wherein Examples 1 to 11 and Comparative Example 1 correspond to the first aspect of the present invention, Example 12 and Comparative Example 2 correspond to the second aspect of the present invention, and Example 13 and Comparative Example 3 correspond to the third aspect of the present invention.

EXAMPLES 1 TO 8

A glass substrate was obtained by depositing a SnO$_2$ film 0.1 $\mu$m thick on a glass plate 1.1 mm thick by means of a thermal CVD method.

The obtained glass substrate was heated up to 240° C. to form thereon a p-type a-SiC:H layer of 150 Å in thickness using a parallel-plate capacitively-coupled type plasma CVD apparatus, whereinto 50 sccm of mixed gas of three types of 1000 ppm diborane, i.e. (A) diborane diluted with monosilane, (B) diborane diluted with methane and (C) diborane diluted with hydrogen (the flow ratio of (A), (B) and (C) was 1:3:1) was introduced and glow discharge decomposition was carried out with rf frequency of 13.56 MHz and rf power of 30 W.

About 20 atm % of carbon was contained in the obtained p-type a-SiC:H layer. The conductivity of the a-SiC:H layer was about $10^{-7}$ ($\Omega$.cm)$^{-1}$.

After exhausting the residual mixed gas, a mixed gas consisting of 20 sccm of monosilane and 30 sccm of methane was introduced into the apparatus to form, without using doping gas, an interlayer comprising a-SiC of which the thickness is shown in Table 1.

Next, after exhausting the residual mixed gas, 50 sccm of monosilane gas was introduced and glow discharge decomposition was carried out with rf frequency of 13.56 MHz and rf power of 30 W in the same manner as described above to form an i-type a-Si:H layer of 7000 Å in thickness. Then, glow discharge decomposition was carried out with rf having the same power as mentioned above, using 100 sccm of 1000 ppm phosphine gas diluted with 20 sccm of monosilane, and hydrogen, to form an n-type a-Si:H film of 300 Å in thickness.

Next, Al was evaporated as a rear electrode using resistive-heating type vacuum evaporation apparatus to make a photoelectric converter.

In the same manner as described above, five photoelectric converters were further made. The Voc and curve factor of the six photoelectric converters were measured under a fluorescent lamp at an illuminance of 200 lux. The results are summarized in Table 1.

mixed gas of three types of 1000 ppm diborane, i.e. (A) diborane diluted with monosilane, (B) diborane diluted with methane and (C) diborane diluted with hydrogen (the flow ratio of (A), (B) and (C) was 1:3:1) was introduced and glow discharge decomposition was carried out with rf frequency of 13.56 MHz and rf power of 30 W.

About 20 atom % of carbon was contained in the obtained p-type a-SiC:H layer. The conductivity of the a-SiC:H layer was about $10^{-7}$ $(\Omega.cm)^{-1}$.

Next, after exhausting the residual mixed gas, 50 sccm of monosilane gas was introduced and glow discharge decomposition was carried out with rf frequency of 13.56 MHz and rf powder of 30 W in the same manner as described above to form a i-type a-Si:H layer of 7000 Å in thickness. Then, glow discharge decomposition was carried out with rf having the same power as mentioned above, using 100 sccm of 1000 ppm phosphine gas diluted with 20 sccm of monosilane, and hydrogen, to form an n-type a-Si:H film of 300 Å in thickness.

Next, Al was evaporated as a rear electrode using

TABLE 1

|  | Thickness of interlayer (Å) | Open-circuit voltage (V) | | | Curve factor (%) | | |
|---|---|---|---|---|---|---|---|
|  |  | Maximum value | Minimum value | Average value | Maximum value | Minimum value | Average value |
| Ex. 1 | 20 | 0.67 | 0.63 | 0.64 | 75.3 | 72.6 | 73.8 |
| Ex. 2 | 40 | 0.67 | 0.64 | 0.66 | 74.0 | 71.7 | 73.1 |
| Ex. 3 | 60 | 0.69 | 0.67 | 0.675 | 72.6 | 71.1 | 71.8 |
| Ex. 4 | 90 | 0.74 | 0.69 | 0.72 | 71.0 | 69.4 | 70.3 |
| Ex. 5 | 120 | 0.73 | 0.69 | 0.70 | 69.2 | 67.5 | 68.4 |
| Ex. 6 | 150 | 0.69 | 0.66 | 0.68 | 67.7 | 63.8 | 65.9 |
| Ex. 7 | 200 | 0.68 | 0.66 | 0.67 | 63.2 | 60.2 | 62.2 |
| Ex. 8 | 250 | 0.67 | 0.63 | 0.65 | 59.8 | 57.1 | 58.2 |
| Com. Ex. 1 | — | 0.62 | 0.60 | 0.605 | 75.2 | 73.8 | 74.5 |

EXAMPLES 9 TO 11

The procedure of Example 4 was repeated except that interlayers were formed at a junction interface of a transparent electrode and a p-type layer (hereinafter referred to as TE/P (Example 9); at a junction interface of an i-type layer and an n-type layer (hereinafter referred to as i/n) (Example 10); and at a junction interface of an n-type layer and Al electrode (hereinafter referred to as n/Al) (Example 11). The Voc and curve factor were measured as in Examples 1 to 8. The results are summarized in Table 2.

resistive-heating type vacuum evaporation apparatus to make a photoelectric converter.

In the same manner as described above, five photoelectric converters were further made. The Voc and curve factor of the six photoelectric converters were measured under a fluorescent lamp at an illuminance of 200 lux. The Voc was 0.60 to 0.62 V (0.606 V in average), and curve factor was 74.5%. These results are summarized in Tables 1 and 2.

EXAMPLE 12 AND COMPARATIVE EXAMPLE 2

TABLE 2

|  | Position of interlayer | Open-circuit voltage (V) | | | Curve factor (%) | | |
|---|---|---|---|---|---|---|---|
|  |  | Maximum value | Minimum value | Average value | Maximum value | Minimum value | Average value |
| Ex. 9 | TE/P | 0.685 | 0.65 | 0.66 | 74.8 | 71.3 | 72.5 |
| Ex. 10 | i/n | 0.66 | 0.62 | 0.65 | 75.0 | 72.0 | 73.9 |
| Ex. 11 | n/Al | 0.67 | 0.63 | 0.66 | 72.8 | 68.7 | 69.9 |
| Com. Ex. 1 | — | 0.62 | 0.60 | 0.605 | 75.2 | 73.8 | 74.5 |

COMPARATIVE EXAMPLE 1

A glass substrate was obtained by depositing a SnO$_2$ film 0.1 μm thick on a glass plate 1.1 mm thick by means of thermal CVD method.

The obtained glass substrate was heated up to 240° C. to form thereon a p-type a-SiC:H layer of 150 Å in thickness using a parallel-plate capacitively-coupled type plasma CVD apparatus, whereinto 50 sccm of A solar cell having the construction shown in FIG. 3 was made as an experiment.

SnO$_2$ of 800 Å in thickness, as a transparent electrode, was deposited on a glass to obtain a substrate.

A p-type a-SiC:H film of 150 Å in thickness was accumulated on the substrate by means of plasma CVD method. Using SiH$_4$, CH$_4$ and B$_2$H$_6$ (diluted to 1000 ppm with hydrogen) as material gas for p-type a-SiC:H, 70 Å was accumulated with the flow rates of SiH$_4$, CH$_4$ and $B_2H_6$ at 10 sccm, 30 sccm and 200 sccm respectively. Then, continuing glow discharge, 80 Å of a-SiC:H was accumulated while gradually decreasing the amount of $B_2H_6$. The flow rate of $B_2H_6$ when the deposition of the p-layer was completed was 0 sccm. An i-type a-Si:H layer of 7000 Å in thickness was deposited by means of glow discharge decomposition. Then, an n-type μc-Si:H layer of 300 Å in thickness was deposited by means of glow discharge decomposition, using a mixed gas of 20 sccm of $SiH_4$ and 100 sccm of 1000 ppm $PH_3$ diluted with $H_2$. Al of 1000 Å in thickness was vacuum evaporated thereon as a rear metal electrode to make a 1 cm² device.

The amount of dopant in the p-type layer obtained with a flow of a constant volume of $B_2H_6$ was 2 atm %.

For comparison, solar cells of a conventional type were made by the same manner as described above, except that a p-type a-SiC:H layer of 150 Å in thickness was deposited under the above constant flow rate.

Figure 6:
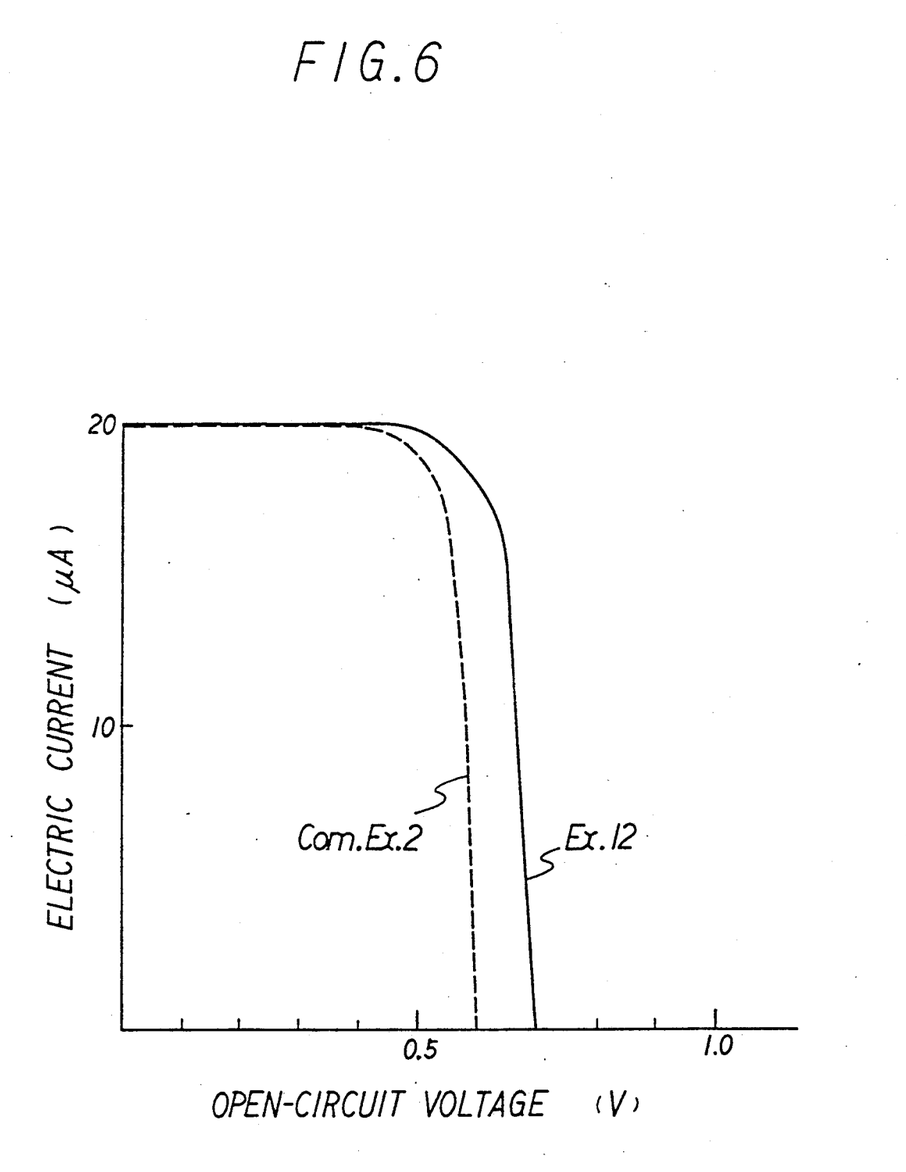
FIG. 6 is a graph showing the V-I characteristic of solar cells obtained in Example 12 and Comparative Example 2.

The V-I characteristic of the obtained two kinds of solar cells was measured under fluorescent light at an illuminance of 200 lux. The results are shown in FIG. 6.

The open circuit voltage of the solar cell of Comparative Example 2 was above 0.6 V. On the other hand, that of the solar cell of Example 12 was 0.70 V. It was observed that the electric current and FF (Curve Fill Factor) were improved a little.

EXAMPLE 13

Figure 7:
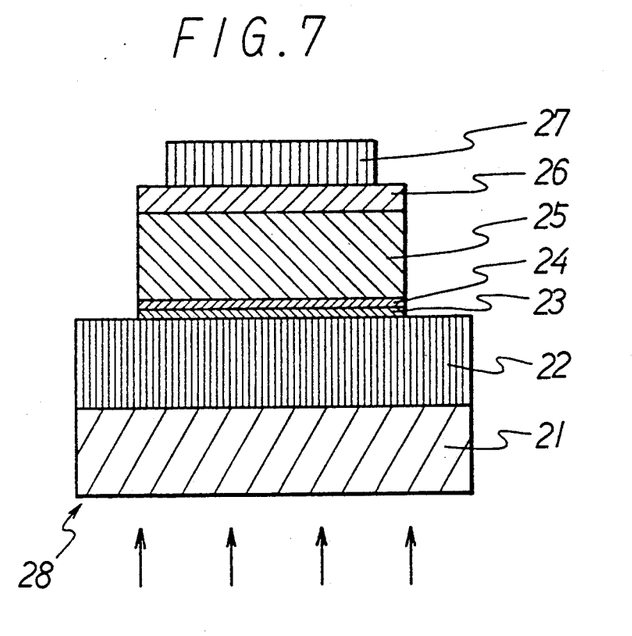
FIG. 7 is a sectional view of a semiconductor device in Example 13 of the third aspect of the present invention.

FIG. 7 shows Example 13 of a semiconductor device of the present invention wherein the semiconductor layer is of a pin-type of triple layer construction. In FIG. 7, there is formed a p-type semiconductor layer 23 of high impurity density between an electrode 22 at the side of a p-type semiconductor layer 24. The semiconductor layer 23 is attached on the top surface of the electrode 22 and at the bottom surface of the p-type semiconductor layer 24.

In Example 13, the construction of the pin-type semiconductor layer is similar to that generally employed in photovoltaic devices, photodiodes, or the like which comprise amorphous semiconductor.

Next, a method of producing the semiconductor device of Example 13 is explained.

First of all, an electrode 22 at the side of a p-layer, which is a transparent electrode, is deposited on a glass plate 21 by means of a sputtering method. $SnO_2$ is used as a material for the transparent electrode. The thickness of the electrode is 5000 Å.

Next, on the electrode 22 at the side of the p-layer, there is formed a p-type semiconductor layer 23 of high impurity density by doping SiC:H with B by means of a plasma CVD method. In forming the p-type semiconductor layer 23 of high impurity density, $SiH_4$, $CH_4$ and $B_2H_6/H_2$ (the concentration of $B_2H_6$ is 1000 ppm) are used. The flow rate is 10 sccm, 30 sccm and 200 sccm, respectively. The thickness of the obtained p-type semiconductor layer 23 of high density is 100 Å, and the impurity density thereof is 4%.

Next, on the semiconductor layer 23, there is formed a p-type semiconductor layer 24 by doping SiC:H with B by means of a plasma CVD method in the same manner as described above, except that the flow rate of $B_2H_6/H_2$ is changed to 50 sccm. The thickness of the obtained p-type semiconductor layer 24 is 100 Å, and the impurity density thereof is 1%.

Thereafter, an i-type semiconductor layer 25 comprising a-Si:H is formed on the p-type semiconductor layer 24 by means of glow discharge decomposition using $SiH_4$ as a material gas. The thickness of the obtained i-type semiconductor layer 25 is 5000 Å.

Next, on the i-type semiconductor layer 25, there is formed an n-type semiconductor layer 26 by means of glow discharge decomposition using $SiH_4$ and $PH_3H$ (the concentration of $PH_3$ is 1000 ppm). The flow rates of $SiH_4$ and $PH_3H_2$ are 10 sccm and 50 sccm, respectively. The thickness of the obtained n-type semiconductor layer 6 is 300 Å, and the impurity density thereof is 0.5%.

Further, an electrode 27 at the side of the n-type semiconductor layer is formed on the n-type semiconductor layer 26 by vacuum evaporating Ag. The thickness of the formed electrode 27 is 1000 Å.

The area of a semiconductor device prepared in accordance with the above method is about 1 cm², but it is possible to prepare devices of 1 to 500 cm² in area. The area of the device is not limited in the present invention.

In the semiconductor device of Example 13, light enters along the direction of the arrows shown in FIG. 7 to generate pairs of electrons and holes in the semiconductor layers 23, 24, 25 and 26 like in the semiconductor device of FIG. 9, and to a generate positive charge at the electrode 22 at the side of the p-layer and a negative charge at the electrode at the side of the n-layer. In the present Example, since the electrode 22 at the side of the p-layer contacts with the p-type semiconductor layer 23 of high density, the contact resistance between them is remarkably decreased. Further, the light absorption loss in the impurity-containing portion does not increase because the p-type semiconductor layer 23 of high density is thin.

COMPARATIVE EXAMPLE 3

The procedure of Example 13 was repeated except that there was formed a semiconductor having the same quality of material as the p-type semiconductor layer 24 and a thickness of 100 Å, by means of the same method for forming the p-type semiconductor layer 4 as in Example 13, instead of the p-type semiconductor layer 23 of high density.

With respect to the semiconductor devices of Example 13 and Comparative Example 3, the V-I characteristic was measured under a solar simulator of 100 mW/cm². The results are shown in FIG. 8.

Figure 8:
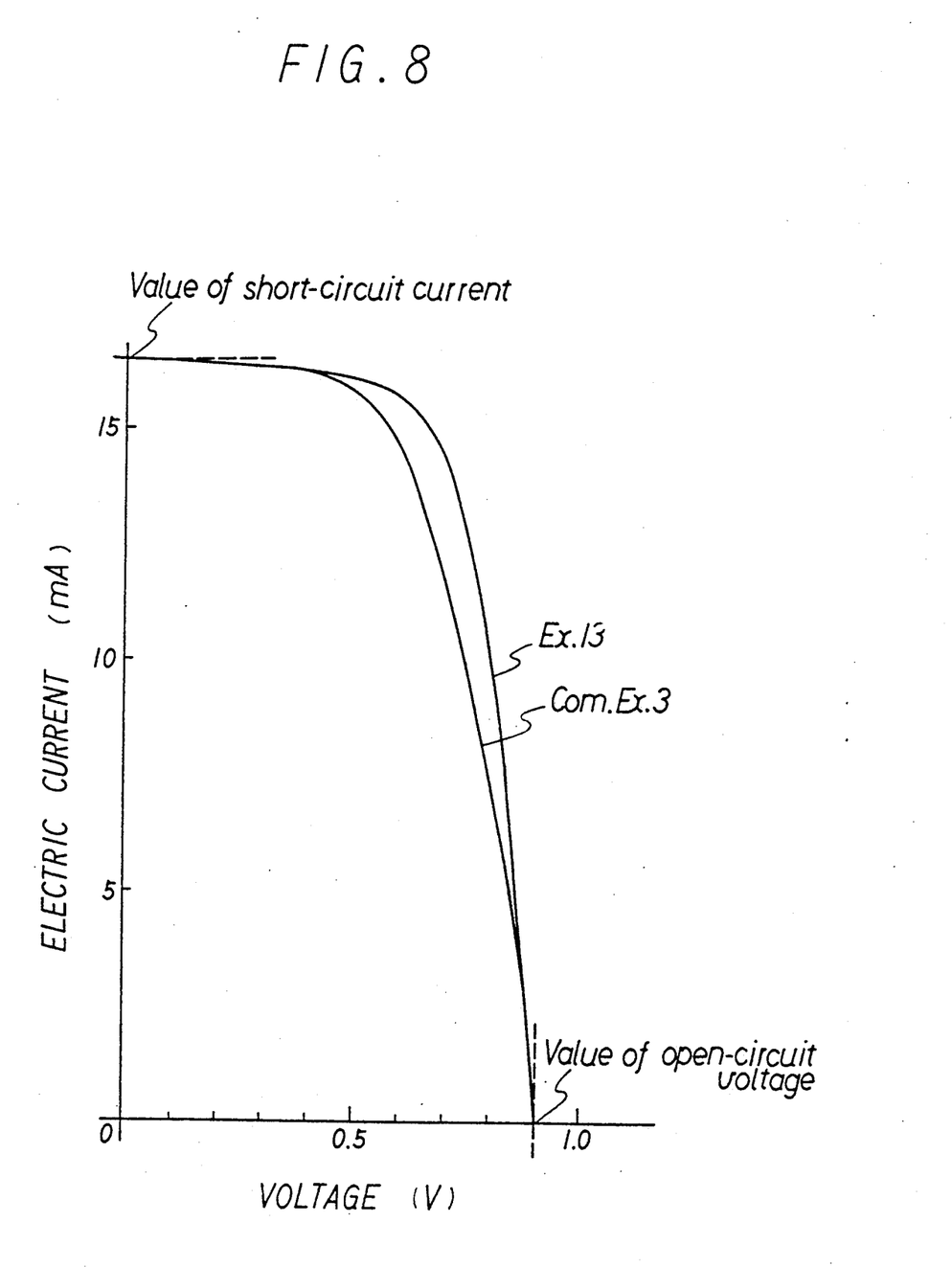
FIG. 8 is a graph showing the V-I characteristic of semiconductor devices in Example 13 and Comparative Example 3.

From the V-I characteristic shown in FIG. 8, the fill factor (F.F.) was calculated by the following formula:

$$\frac{\text{Maximum output}}{\text{Short current} \times \text{Open-circuit voltage}} \times 100$$

The fill factor of Example 13 was about 70%, while that of Comparative Example 3 was about 60%.

In Example 13, the p-type semiconductor layer 23 of high impurity density was interposed between the electrode 22 at the side of the p-type layer and the p-type semiconductor layer 24. However, the same effect can be obtained when interposing an n-type semiconductor layer of high impurity density between the n-type semiconductor layer and the electrode 27 at the side of the n-layer.

Further, in Example 13, light enters from the electrode at the side of the p-layer. But light might also enter from the electrode 27 at the side of the n-layer by making the electrode 27 transparent.

Though in Example 13 only a set of the p-type, i-type and n-type semiconductor layers are formed, the number of sets might be 6 to 15, and further the accumulation order might be such that n-type, i-type and p-type layers are formed in order from the substrate in FIG. 7.

SnO$_2$ was used as a material for the transparent electrode in Example 13, but other material such as ITO is employable. Further, Ag was used as a material of the electrode 27 at the side of the n-layer, but there can be used other conductive metal such as Al or Au; a conductor such as silicide which is a compound of silicon and another metal; a laminated electrode of these conductive metals and conductors, or the like.

In Example 13, the material of the semiconductor layer 23 of high impurity density was the same as that of the p-type semiconductor layer 24 but it might be different from the material of the p-type semiconductor layer 24 as long as it is a p-type semiconductor. For example, Si:H is employable instead of SiC:H used in Example 13. In that case, not only B used in Example 13 but also other impurities might be used. Of course, the kind of impurity material can be changed, while employing the same type of semiconductor layer. This modification can also be applied to an n-type semiconductor layer of high impurity density and an n-type semiconductor layer.

The impurity density in Example 13 changed discontinuously from the p-type semiconductor layer 24 to the p-type semiconductor layer 23 of high impurity density. However, it may be increased gradually from the p-type (or n-type) semiconductor layer to the p-type (or n-type) semiconductor layer of high impurity density.

As a method of producing each layer of the semiconductor device in Example 13, a sputtering method, vacuum evaporation method, plasma CVD method, or the like were used. But any other method is employable as long as a thin film can be obtained by the method. A CVD apparatus employable in the present invention includes, for instance, a parallel-plate capacitively-coupled type plasma CVD apparatus, conductively-coupled type plasma CVD apparatus, thermal CVD apparatus, ECR plasma CVD apparatus, photo CVD apparatus, excited species CVD apparatus.

The materials usable to form each layer are not limited to those employed in Example 13.

As is described in detail hereinbefore, the semiconductor device according to the first and second aspects of the present invention has larger Voc and electric current (working current) at a specific voltage than conventional devices, thereby it can preferably be used in consumer-use solar cells, particularly in such solar cells that are equipped with electrical and electric equipment used under low-illumination light source such as fluorescent lamp.

Further, the semiconductor device according to the third aspect of the present invention not only can reduce the contact resistance between a p-type semiconductor layer and an electrode at the side of the p-type layer and/or between an n-type semiconductor layer and an electrode at the side of the n-layer, but also maintain the light absorption loss small, whereby photoelectric conversion efficiency can be improved in comparison with conventional semiconductor devices.

What we claim is:

1. A semiconductor device comprising at least one set of semiconductor layers, said set having a p-i-n structure wherein
    (1) p represents a p-type semiconductor layer which is an at least partially amorphous material doped with a p-type dopant,
    (2) i represents an intrinsic semiconductor layer which is an at least partially amorphous semiconductor material, and
    (3) n represents an n-type semiconductor layer which is an at least partially amorphous semiconductor material doped with an n-type dopant,
    said semiconductor device further comprising at least one electrode provided on the outer surface of the outermost p-type semiconductor layer and at least one electrode provided on the outer surface of the outermost n-type semiconductor layer,
    wherein at least one interlayer is interposed at at least one interface between two semiconductor layers of said p-i-n structure, said interlayer being selected from the group consisting of $Si_{1-x}C_x$:X:Y, $Si_{1-x}N_x$:X:Y and $Si_{1-x}O_x$:X:Y, wherein x satisfies the relationship $0<x<1$, X is selected from the group consisting of H, Cl, F and Br; and Y is selected from the group consisting of H, Cl, F and Br.

2. The device of claim 1, wherein the interlayer is $Si_{1-x}C_x$:H, wherein x satisfies the relationship $0<x<1$.

3. The device of claim 1, wherein the thickness of the interlayer is 10 to 500 Å.

4. The device of claim 2, wherein the thickness of the interlayer is 10 to 500 Å.

5. A semiconductor device comprising at least one set of semiconductor layers, said set having a p-i-n structure wherein
    (1) p represents a p-type semiconductor layer which is an at least partially amorphous material doped with a p-type dopant,
    (2) i represents an intrinsic semiconductor layer which is an at least partially amorphous semiconductor material, and
    (3) n represents an n-type semiconductor layer which is an at least partially amorphous semiconductor material doped with an n-type dopant,
    said semiconductor device further comprising at least one electrode provided on the outer surface of the outermost p-type semiconductor layer and at least one electrode provided on the outer surface of the outermost n-type semiconductor layer,
    wherein at least one doped semiconductor layer selected from the group consisting of said p-type semiconductor layer and said n-type semiconductor layer has a dopant gradient in the region extending from the interface with the intrinsic layer to a depth which is less than the entire thickness of said doped semiconductor layer, said dopant gradient being such that the dopant concentration in said region continuously increases away from the interface with the intrinsic layer from zero to the maximum dopant concentration in said doped semiconductor layer.

6. The device of claim 5, wherein at least one of the p-type and n-type semiconductor layers is a layer of a-SiC:H.

7. The device of claim 5, wherein at least one of the p-type and n-type semiconductor layers is a layer of a-Si:H.

8. The device of claim 5, wherein the depth of said region having a dopant gradient is at least 20 Å.

9. The device of claim 5, wherein the depth of said region having a dopant gradient is at least 100 Å.

10. The device of claim 5, wherein the dopant in the p-type semiconductor layer is an element selected from the group consisting of B, Al, Ga, In and Tl.

11. The device of claim 6, wherein the dopant in the p-type semiconductor layer is an element selected from the group consisting of B, Al, Ga, In and Tl.

12. The device of claim 7, wherein the dopant in the p-type semiconductor layer is an element selected from the group consisting of B, Al, Ga, In and Tl.

13. The device of claim 5, wherein the dopant in the n-type semiconductor layer is an element selected from the group consisting of N, P, As, Sb, Te and Po.

14. The device of claim 6, wherein the dopant in the n-type semiconductor layer is an element selected from the group consisting of N, P, As, Sb, Te and Po.

15. The device of claim 7, wherein the dopant in the n-type semiconductor layer is an element selected from the group consisting of N, P, As, Sb, Te and Po.

16. A semiconductor device comprising at least one set of semiconductor layers, said set having a p-i-n structure consisting of:
   (1) a p-type semiconductor layer which is an at least partially amorphous material doped with a p-type dopant,
   (2) an intrinsic semiconductor layer which is an at least partially amorphous semiconductor material, and
   (3) an n-type semiconductor layer which is an at least partially amorphous semiconductor material doped with an n-type dopant,
   wherein p represents said p-type semiconductor layer, i represents said intrinsic semiconductor layer, and n represents said n-type semiconductor layer,
   said semiconductor device further comprising at least one electrode provided on the outer surface of the outermost p-type semiconductor layer and at least one electrode provided on the outer surface of the outermost n-type semiconductor layer,
   wherein a highly doped semiconductor layer is interposed at at least one interface between an electrode and an adjacent doped semiconductor layer of said p-i-n structure, said highly doped semiconductor layer having the same type of conductivity as said adjacent doped semiconductor layer and having a dopant concentration which is at least twice the dopant concentration of said adjacent doped semiconductor layer.

17. The device of claim 16, wherein the conductivity of at least one said highly doped semiconductor layer is of the p-type.

18. The device of claim 16, wherein the conductivity of at least one said highly doped semiconductor layer is of the n-type.

19. The device of claim 16, wherein the conductivity of at least one said highly doped semiconductor layer is of the p-type, and the conductivity of at least another said highly doped semiconductor layer is of the n-type.

20. The device of claim 16, wherein the thickness of said highly doped semiconductor layer is 10 to 300 Å.

21. The device of claim 16, wherein the dopant concentration of said highly doped semiconductor layer is at least four times the dopant concentration of said adjacent doped semiconductor layer.

* * * * *

UNITED STATES PATENT AND TRADEMARK OFFICE
CERTIFICATE OF CORRECTION

PATENT NO. : 5,032,884
DATED : July 16, 1991
INVENTOR(S) : Hideo Yamagishi et al It is certified that error appears in the above-identified patent and that said Letters Patent is hereby corrected as shown below:

On the cover page, Item [63], fourth line, "Ser. No. 924,980" should read -- Ser. No. 924,960 --.

Signed and Sealed this

Twenty-ninth Day of December, 1992

Attest:

DOUGLAS B. COMER

*Attesting Officer*  *Acting Commissioner of Patents and Trademarks*